United States Patent
Okumura et al.

(10) Patent No.: US 7,647,031 B2
(45) Date of Patent: Jan. 12, 2010

(54) VEHICLE RECEIVER SYSTEM IN WHICH A SINGLE RECEIVER CIRCUIT IS CONTROLLED TO RECEIVE SIGNALS TRANSMITTED FROM A PLURALITY OF REMOTE DEVICES HAVING RESPECTIVELY DIFFERENT TRANSMISSION FREQUENCIES

(75) Inventors: Ryozo Okumura, Kariya (JP); Akihiro Taguchi, Oobu (JP)

(73) Assignee: DENSO Corporation, Kariya (JP)

( * ) Notice: Subject to any disclaimer, the term of this patent is extended or adjusted under 35 U.S.C. 154(b) by 475 days.

(21) Appl. No.: 11/485,968

(22) Filed: Jul. 14, 2006

(65) Prior Publication Data
US 2007/0021082 A1  Jan. 25, 2007

(30) Foreign Application Priority Data
Jul. 19, 2005  (JP)  ............ 2005-208455

(51) Int. Cl.
*H03D 5/00* (2006.01)
(52) U.S. Cl. .............. 455/142; 455/146; 455/147; 455/150.1; 455/151.1; 455/151.4; 340/447; 340/442; 340/445; 340/426.13; 340/426.16
(58) Field of Classification Search .......... 455/142, 455/146, 147, 150.1, 151.1, 151.4, 168.1, 455/68, 552.1, 152.1; 340/447, 442, 445, 340/426.13, 426.16
See application file for complete search history.

(56) References Cited

U.S. PATENT DOCUMENTS

| | | | |
|---|---|---|---|
| 5,463,374 A * | 10/1995 | Mendez et al. | .............. 340/442 |
| 5,661,651 A | 8/1997 | Geschke et al. | |
| 5,940,001 A * | 8/1999 | Okayasu et al. | ............ 340/5.64 |
| 6,448,892 B1 * | 9/2002 | Delaporte | .................... 340/442 |
| 6,885,283 B2 * | 4/2005 | O'Connor et al. | .......... 340/5.61 |
| 2002/0087250 A1 * | 7/2002 | Pacsai | ......................... 701/78 |
| 2004/0113765 A1 | 6/2004 | Suitsu | |
| 2005/0191966 A1 * | 9/2005 | Katsuta | ....................... 455/68 |

FOREIGN PATENT DOCUMENTS

| | | |
|---|---|---|
| DE | 103 04 081 | 5/2004 |
| EP | 1 107 498 | 6/2001 |

(Continued)

OTHER PUBLICATIONS

German Official Action dated Apr. 21, 2008, issued in corresponding German Application No. 10 2006 033 272.5-35, with English translation.

(Continued)

*Primary Examiner*—Sanh D Phu
(74) *Attorney, Agent, or Firm*—Nixon & Vanderhye P.C.

(57) ABSTRACT

A vehicle-mounted receiver system includes a receiver apparatus that is controlled for receiving, in common, transmissions from a plurality of external devices such as a remote key, smart key, etc., having respectively different transmission frequencies. The receiving frequency at the current time is selected based on criteria such as the insertion/non-insertion status of the ignition key, or whether an interrogation signal has been transmitted to a specific external device so that a response transmission is be received from that device during a specific time interval and the receiving frequency is to be set accordingly during that specific interval.

24 Claims, 10 Drawing Sheets

FOREIGN PATENT DOCUMENTS

| | | |
|---|---|---|
| EP | 1 428 694 A2 | 6/2004 |
| EP | 1 533 146 A2 | 5/2005 |
| JP | 04-277934 | 10/1992 |
| JP | 2001-168744 | 6/2001 |
| JP | 2004-009923 | 1/2004 |
| JP | 2004-189072 | 7/2004 |

OTHER PUBLICATIONS

Office Action issued Aug. 4, 2009 in corresponding Japanese Application No. 2005-208455 with an at least partial English-language translation thereof.

\* cited by examiner

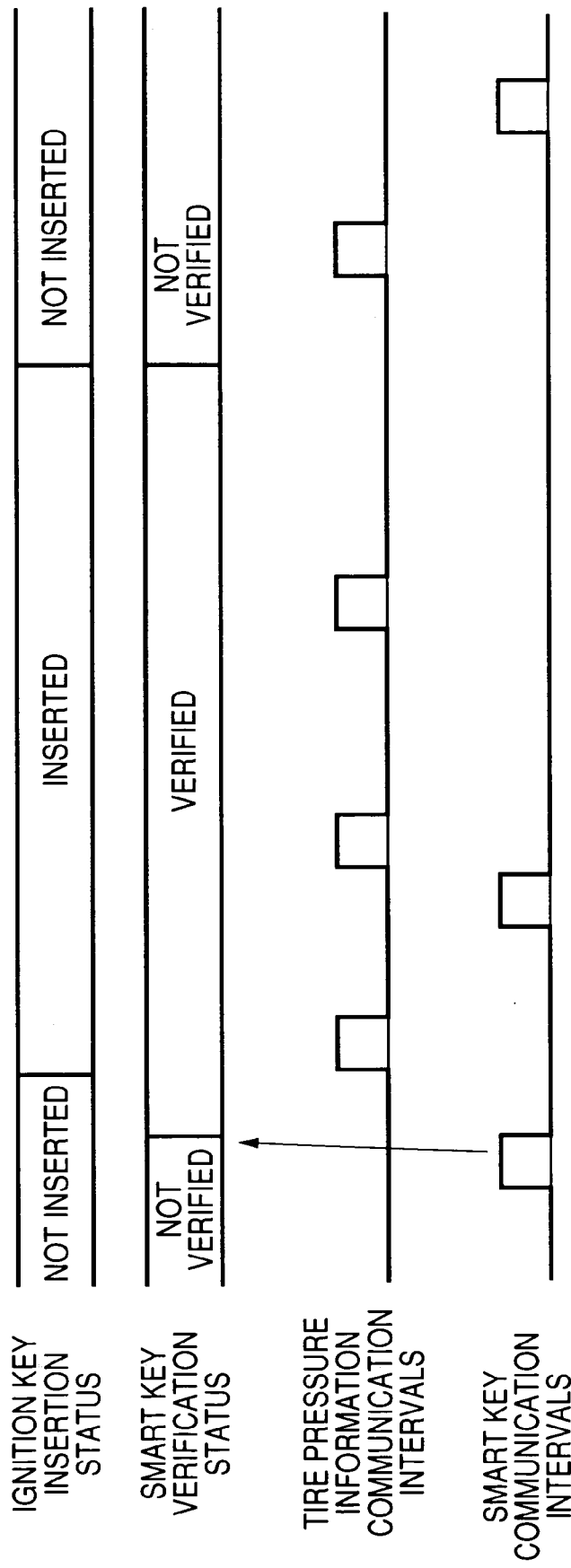

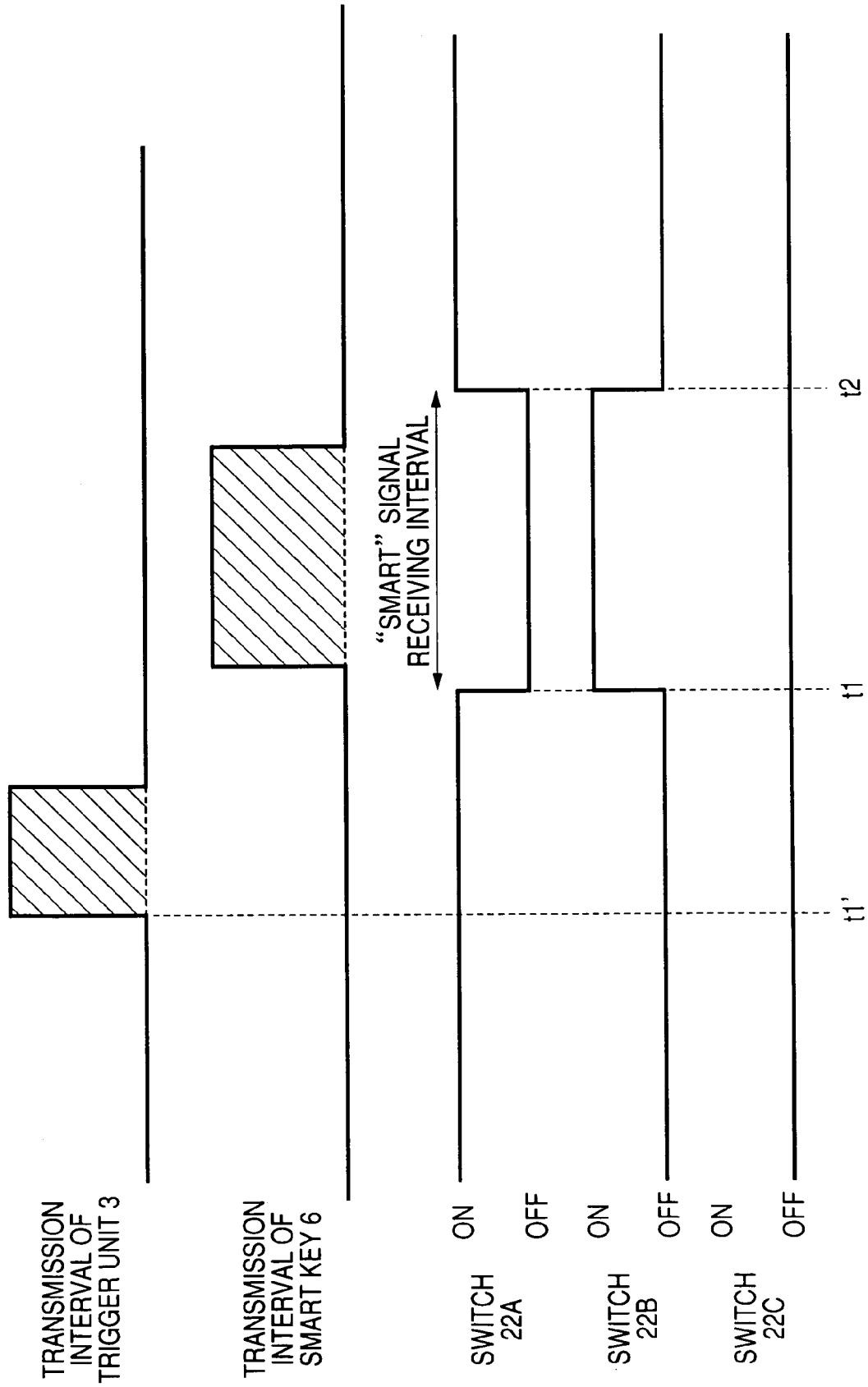

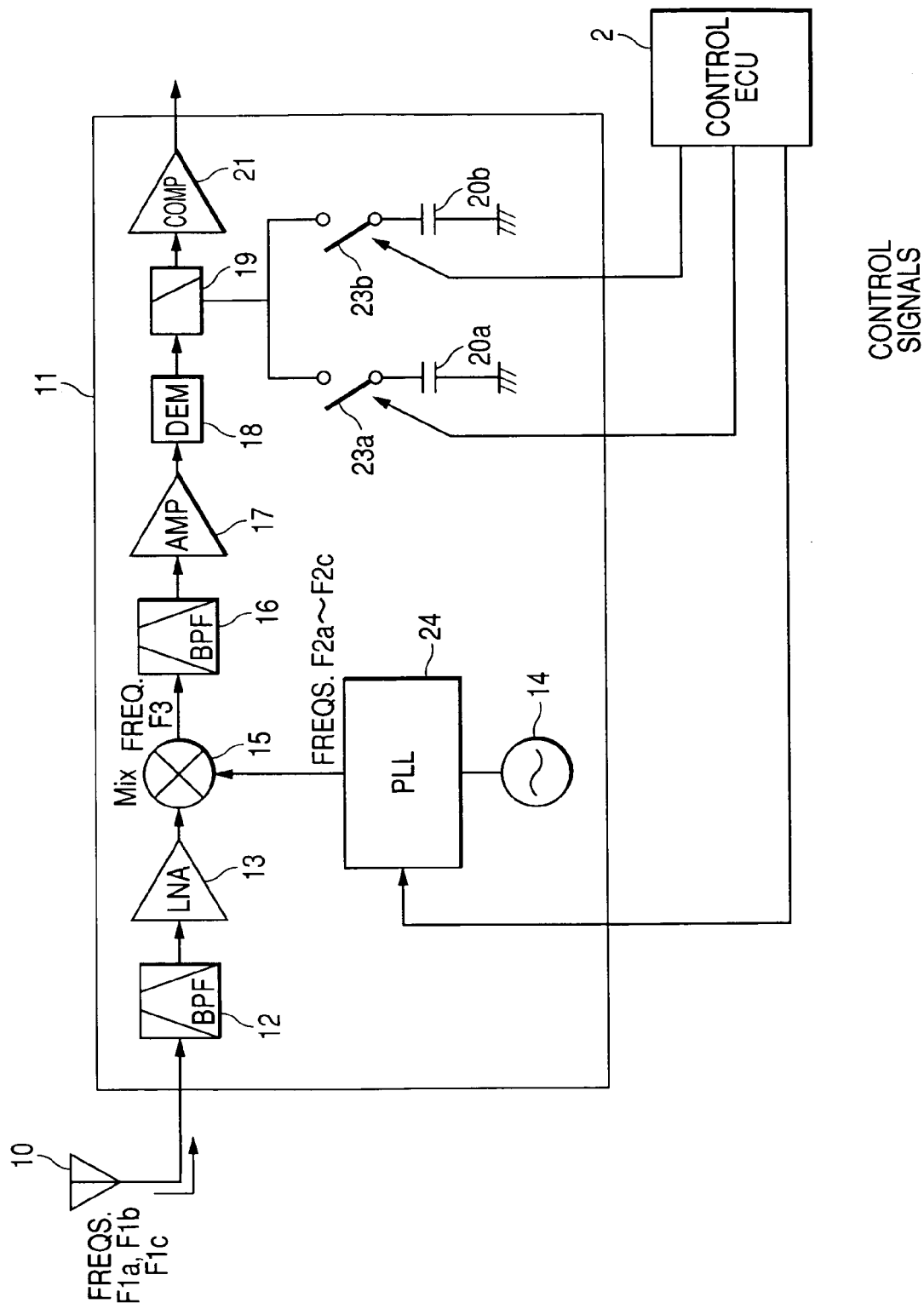

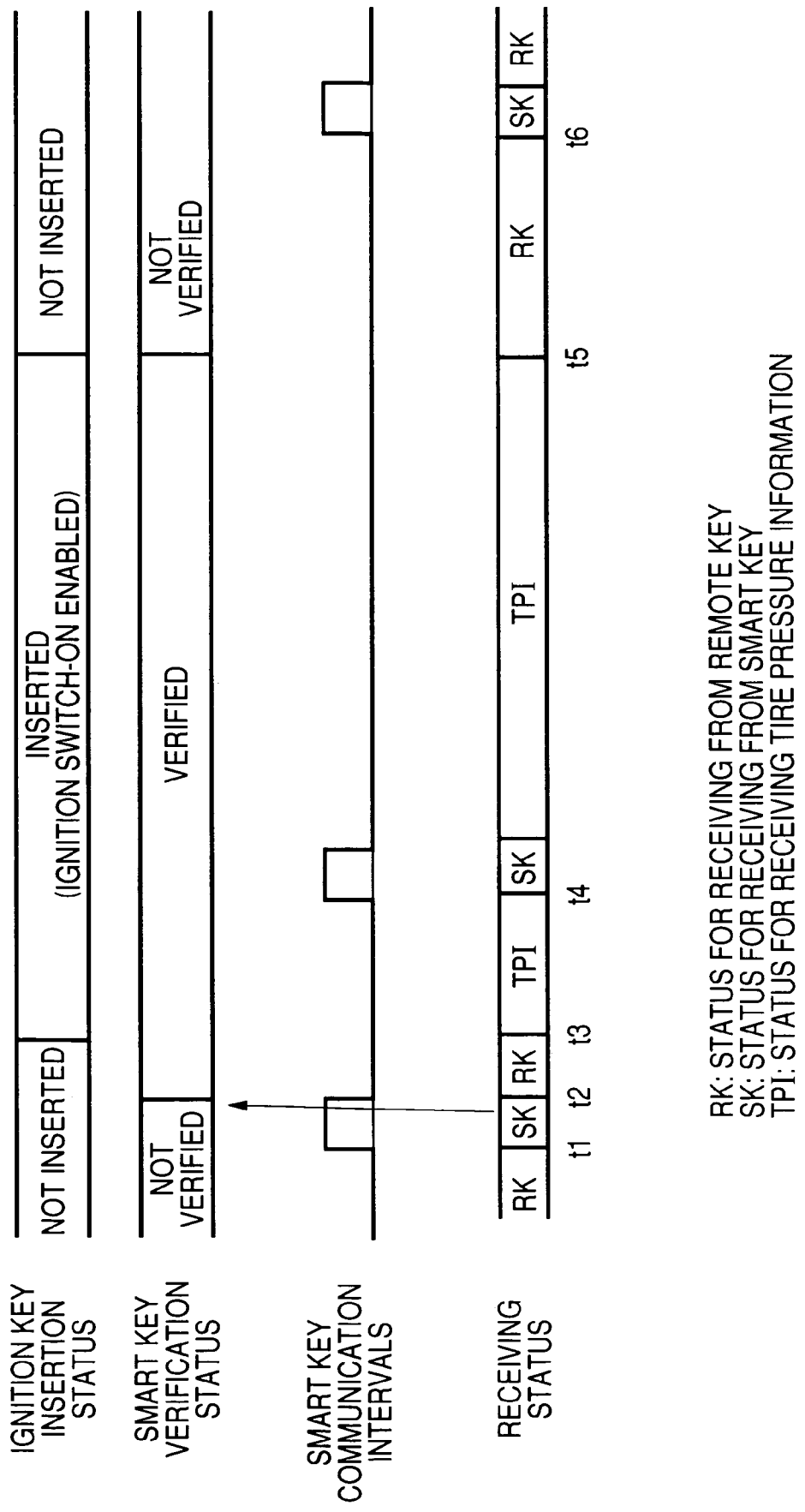

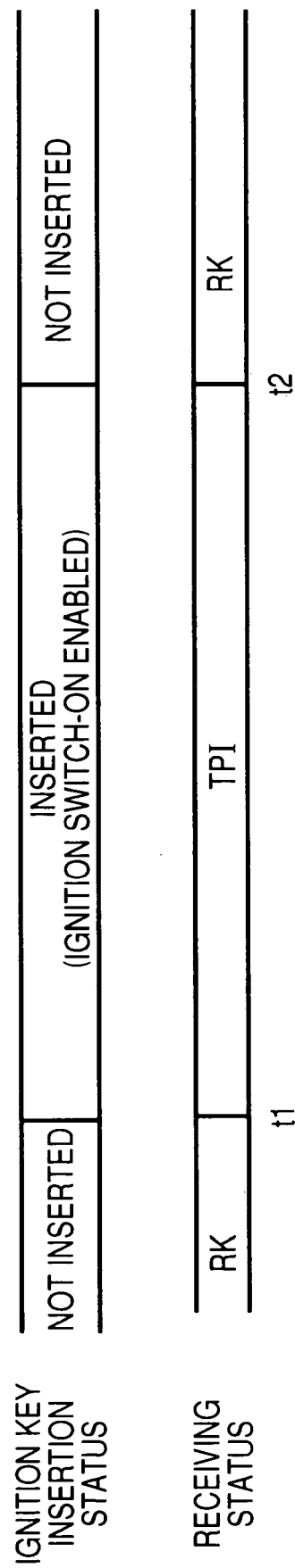

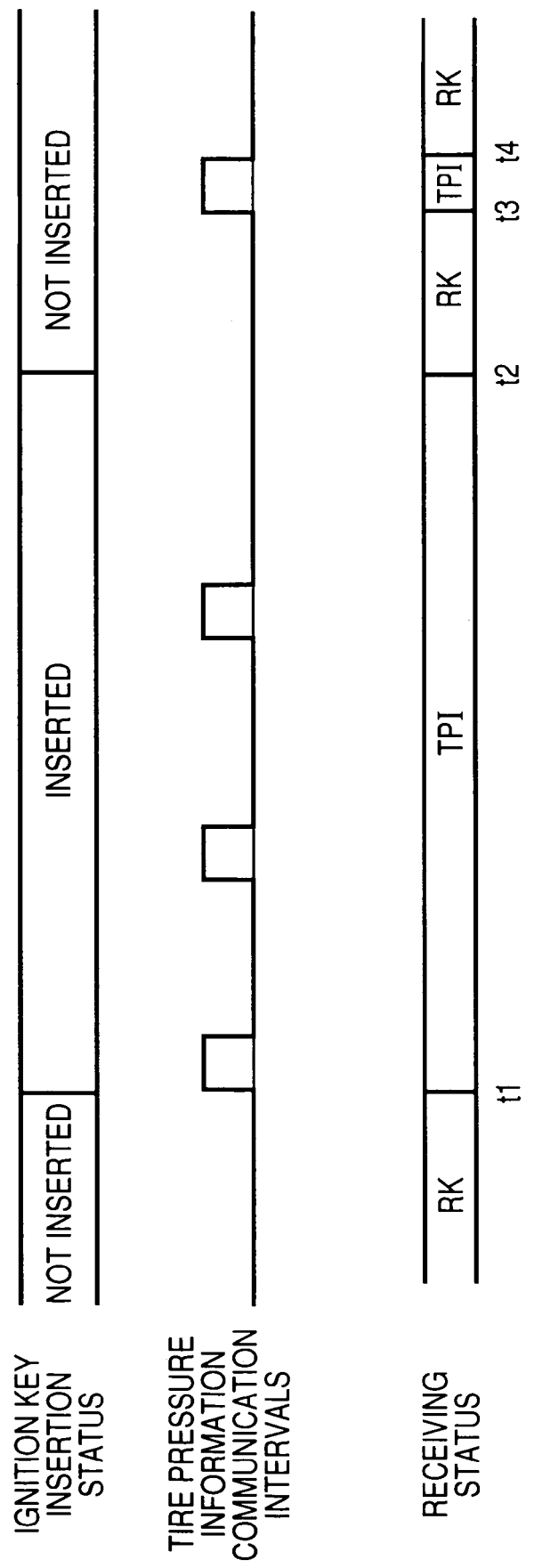

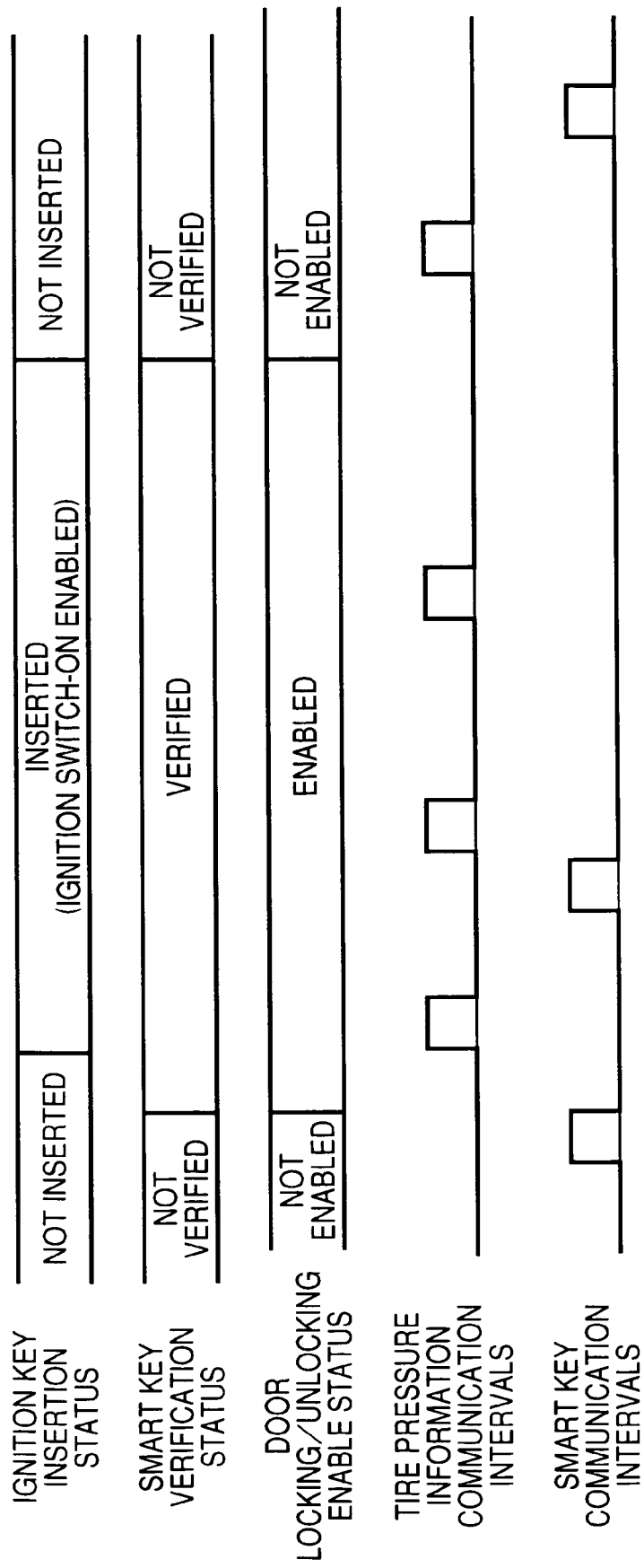

VEHICLE RECEIVER SYSTEM IN WHICH A SINGLE RECEIVER CIRCUIT IS CONTROLLED TO RECEIVE SIGNALS TRANSMITTED FROM A PLURALITY OF REMOTE DEVICES HAVING RESPECTIVELY DIFFERENT TRANSMISSION FREQUENCIES

CROSS-REFERENCE TO RELATED APPLICATIONS

This application is based on and incorporates herein by reference Japanese Patent Application No. 2005-208455 filed on Jul. 19, 2005.

BACKGROUND OF THE INVENTION

1. Field of Application

The present invention relates to a receiver system for installation in a vehicle, which receives signals that are respectively transmitted by a plurality of devices or systems for such purposes such as vehicle door unlocking, conveying tire pressure information, etc.

2. Description of Related Art

Various types of remote control or remote detection systems and devices are now utilized with motor vehicles, such as a tire pressure detection apparatus that detects the air pressure within each of the vehicle tires and transmits a signal conveying information relating to the detected pressure values, a keyless entry system that locks/unlocks a vehicle door in response to transmissions from a device such as a "remote key", a "smart entry" system (Smart Entry is a registered trade mark) having functions such as enabling switch-on of the vehicle ignition and/or engine starting only if a security cipher transmitted from a "smart card" indicates that the driver is a valid user of the vehicle, etc.

At present, the various signals that are transmitted by such systems are received by respectively different receiver apparatuses, with the communication frequency, data specifications and operation timings being different between each of the receiver apparatuses, e.g., respective receiver apparatuses for the tire pressure detection apparatus, the keyless entry system, the smart entry system, etc. An example of this is described in Japanese patent publication No. 2004-189072.

However this has the problem that the number of components required to constitute the plurality of receiver apparatuses is high, so that the manufacturing cost is accordingly high.

It should be understood that the term "receiver apparatus" or receiver system" as used in descriptions herein and in the appended claims is used with the significance of "wireless receiver apparatus" or "wireless receiver system".

SUMMARY OF THE INVENTION

It is an objective of the present invention to overcome the above problem, by providing a receiver system for installation in a motor vehicle (referred to in the following simply as a vehicle receiver system) whereby a single receiver apparatus is used in common for receiving signals that are respectively transmitted by a plurality of systems or apparatuses such as a tire pressure detection apparatus, keyless entry system, smart entry system, etc.

In the description of embodiments given hereinafter, the term "receiver" or "receiving apparatus" is to be understood as signifying a radio receiver for receiving high-frequency radio waves (e.g., at several hundred MHz). However the invention is applicable in general to various types of wireless receiving apparatus, for which a receiving frequency (tuned frequency) can be selected by an externally supplied control signal or signals.

To achieve the above objective, the invention provides a receiver system for installation in a motor vehicle, having a receiver apparatus with a receiving antenna for receiving a plurality of modulated transmitted signals having respective ones of a predetermined plurality of carrier frequencies, to derive an antenna input signal, and a receiver circuit that is controlled by an externally supplied control signal to select a specific one of the carrier frequencies as a currently determined receiving frequency, and comprises means for operating on the antenna input signal to obtain demodulated data from a received signal that corresponds to the currently determined receiving frequency.

The receiver system further comprises transmission timing prediction means, for generating and supplying the control signal to the receiver circuit, and is characterized in that the transmission timing prediction means determines a value for the currently determined receiving frequency based on predetermined criteria relating to equipment of the vehicle.

These criteria can include the result of a judgement made as to whether a condition of the vehicle equipment indicates that a driver is currently within the vehicle, for example with this judgement being based on whether or not the ignition switch is inserted in the key cylinder, or the ignition switch has been set to the ON position. When a device such as a remote key is used externally for remote control of vehicle door locking/unlocking, it is unnecessary to have a capability for receiving transmissions from such a device after the driver has entered the vehicle. Hence with the present invention, the receiving circuit is controlled to receive such transmissions only when the vehicle equipment status (ignition key or ignition switch status) does not indicate that the driver is in the vehicle, and is controlled to receive transmissions from a different device when that vehicle equipment status indicates that the driver is in the vehicle.

Alternatively or in addition, bidirectional communication may be performed between the receiver system and one or more external devices (i.e., external to the receiver system) such as a sensor signal transmitter of a tire pressure detection system, with a vehicle-mounted trigger device of the tire pressure detection system repetitively transmitting an interrogation signal directed to the sensor signal transmitter. In that case, since the time which will be taken for the external device to transmit a response signal and the duration of the response transmission, are each known, the receiving frequency of the receiver circuit can be set appropriately for receiving that response transmission, during a time interval which contains the interval of the response transmission.

Alternatively stated, the interval in which the response transmission will be received by the receiver circuit is predicted beforehand, and the receiving frequency of the receiver circuit is set to the transmission frequency (carrier frequency) of that specific external device only for the duration of the predicted transmission interval.

In that way, it becomes possible for a single receiver circuit to be utilized in common for receiving transmissions from a plurality of external devices having respectively different transmission frequencies.

The receiver circuit preferably comprises:

first filter means for performing bandwidth limiting of the antenna input signal to obtain a bandwidth-limited input signal, amplifier means for amplifying the bandwidth-limited input signal to obtain an amplified input signal, local oscillator means controllable for producing a local oscillator signal at a selected one of a plurality of respectively different fixed frequencies, intermediate frequency generating means for converting the amplified input signal to an intermediate frequency signal, at a fixed intermediate frequency whose value is a difference between a carrier frequency of the amplified input signal and the local oscillator frequency, second filter means for performing bandwidth limiting of the intermediate frequency signal, and demodulator means for demodulating the intermediate frequency signal to obtain the demodulated data. With such a receiver circuit, the control signal is applied to control the local oscillator means such as to set the local oscillator frequency at a value for receiving a transmitted signal corresponding to the currently determined one of the plurality of receiving frequencies.

The local oscillator means can comprise a plurality of local oscillators, and a plurality of switching elements, respectively coupled between the intermediate frequency generating means (e.g., a mixer) and a corresponding one of the plurality of local oscillators, with the control signal controlling the switching elements to connect a specific one of the local oscillators to the intermediate frequency generating means, and with the specific local oscillator generating a local oscillator signal at a frequency appropriate for establishing the currently determined receiving frequency.

Alternatively, the local oscillator means can comprise a PLL (phase lock loop) circuit for generating the local oscillator signal, with the PLL supplying the local oscillator signal to the intermediate frequency generating means, and with the control signal controlling the PLL to set the local oscillator signal to a frequency appropriate for establishing the currently determined receiving frequency.

The plurality of receiving frequencies, each of which may be set as the currently determined receiving frequency of the receiver circuit, can for example correspond to the respective transmission frequencies of a remote key of a remote entry system, a smart key of a smart entry system, a sensor signal transmitter of a tire pressure detection system of the vehicle, etc.

BRIEF DESCRIPTION OF THE DRAWINGS

FIGS. 4A, 4B are timing diagrams for describing the operation of the embodiment;

FIG. 5 is a block diagram of a receiver apparatus of a second embodiment;

FIG. 6 is a timing diagram for describing the operation of a third embodiment;

FIG. 7 is a timing diagram for describing the operation of a fourth embodiment;

FIG. 8 is a timing diagram for describing the operation of a fifth embodiment; and FIG. 9 is a timing diagram for describing the operation of a sixth embodiment.

DESCRIPTION OF PREFERRED EMBODIMENTS

Figure 1:
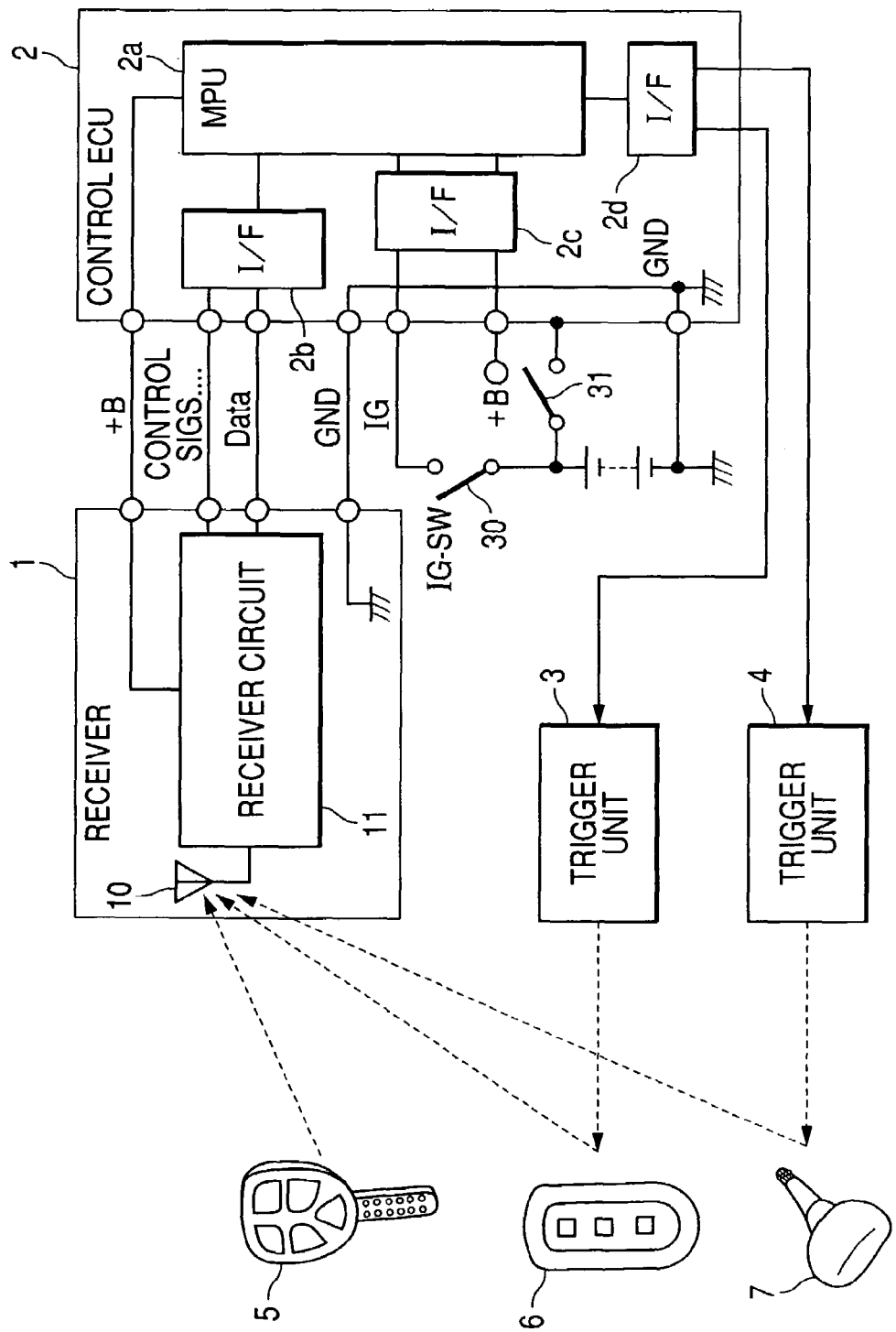
FIG. 1 is a general system diagram of an embodiment of a vehicle receiver system.

The invention will be described in the following referring to specific embodiments. Components having identical functions in each of the embodiments are designated by identical reference numerals in the drawings.

First Embodiment

Figure 2:
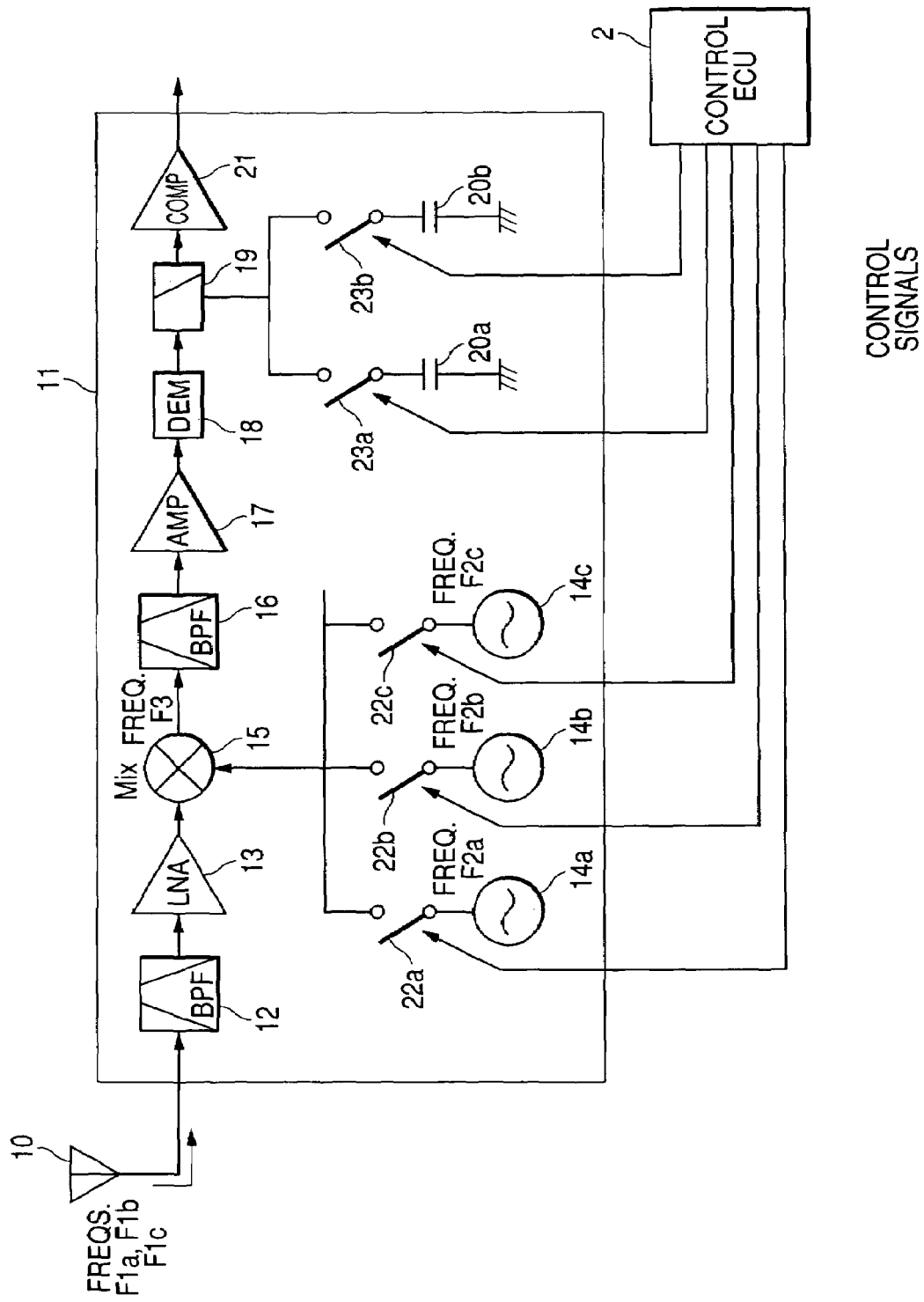
FIG. 2 is a block diagram of a receiver apparatus of the embodiment.

FIG. 1 shows the general configuration of a first embodiment of a vehicle receiver system. FIG. 2 is a block diagram showing a specific configuration for a receiver apparatus 1 of the first embodiment. As shown, the vehicle receiver system includes the receiver apparatus 1, a control ECU (electronic control unit) 2, and trigger units 3 and 4 (i.e., devices for transmitting interrogation signals, at respectively different transmission frequencies), all of which are installed on a vehicle. The vehicle receiver system further includes a remote entry key, which is carried by a user of the vehicle. This is an integral combination of a remote key 5, which incorporates a transmitter that can be actuated by the user to transmit a signal utilized by a keyless entry system of the vehicle, for locking/unlocking a vehicle door from a remote position, and a conventional ignition key 5a which must be inserted into the key cylinder of the vehicle before actuating the ignition switch of the vehicle. The system further includes a smart key 6 of a smart entry system (as described hereinafter), and a set of four sensor transmitters 7 (only one of which is shown) which are mounted on respective vehicle wheels as part of a tire pressure detection apparatus, for transmitting information relating to detected tire pressures.

Specifically, the functions of the remote entry system are implemented by the remote key 5 in conjunction with the receiver apparatus 1 and control ECU 2, while at least part of the functions of the smart entry system are implemented by the smart key 6 and trigger unit 3 in conjunction with the receiver apparatus 1 and control ECU 2, and the functions of the tire pressure detection apparatus are implemented by the sensor signal transmitters and trigger unit 4 in conjunction with tire pressure sensors (not shown in the drawings), the receiver apparatus 1 and control ECU 2

The receiver apparatus 1 receives respective signals that are transmitted from the remote key 5, smart key 6 and sensor signal transmitters 7, each signal being modulated to convey a command code, identification code or detection results, and the control ECU 2 performs various operations based upon the contents of the received signals after demodulation.

In the receiver circuit 11, the antenna 10 receives respective transmission signals from by the remote key 5, smart key 6 and sensor signal transmitters 7, the receiver circuit 11 receives the resultant antenna signal from the antenna 10 and is controlled by the control ECU 2 to select a receiving frequency corresponding to the transmission frequency of a signal that is to be received at the current point in time. The resultant received signal is demodulated in the receiver circuit 11, with resultant demodulated data being supplied to the control ECU 2. The control ECU 2 performs various control operations based upon the demodulated data, and also controls the selection of the aforementioned specific transmission frequency by the receiver circuit 11.

The receiver apparatus 1 operates from a power supply voltage +B (with respect to ground potential GND), supplied via a microcomputer 2a of the control ECU 2.

In addition to the microcomputer 2a, the control ECU 2 includes three interface units 2b, 2c, 2d, for respectively coupling the microcomputer 2a to the receiver apparatus 1, to the switches 30, 31, and to the trigger units 3, 4.

As described in detail hereinafter, the control ECU 2 performs processing for determining the specific receiving frequency that is to be currently selected by the receiver apparatus 1. This determination is made either:

(a) (in the case of unidirectional communication with a device) based on a currently existing condition, e.g., the insertion or non-insertion status of the ignition key 5a in the key cylinder of the vehicle, or (b) (in the case of bidirectional communication with a device) based on predicting a time interval in which a transmitted signal will be received from a specific device that currently is an interrogation object, i.e., a device to which a trigger signal has been directed and so from which a corresponding response transmission may be received during a specific time interval. That is to say, processing is repetitively executed to detect whether the start of such a time interval has arrived, as described hereinafter.

Control of the receiving frequency that is selected by the receiver apparatus 1 is effected by control signals CS which are supplied by the control ECU 2 to the receiver apparatus 1.

For example, when the microcomputer 2a of the control ECU 2 sends a signal via the interface unit 2d to the trigger unit 3 which thereby transmits a trigger signal, then if the smart key 6 receives that trigger signal, it is predetermined that the smart key 6 will then begin to send a transmission signal to the receiver apparatus 1 (after a known amount of delay, continuing for a known duration) at a transmission frequency that is predetermined as corresponding to the smart key 6. Hence the control ECU 2 can predict the timing and duration of each interval in which a transmission may be received from the smart key 6, and the transmission frequency.

With this embodiment, a single control ECU 2 determines the appropriate receiving frequency of the receiver apparatus 1 in common for each of the remote key 5, smart key 6 and sensor signal transmitters 7. However this is not essential. It would be equally possible to utilize separate ECUs to perform receiving frequency determination processing respectively separately for each of the remote key 5, smart key 6 and sensor signal transmitters 7, with these separate ECUs supplying resultant derived data to a control ECU such as the control ECU 2.

When a trigger signal is transmitted from the trigger unit 3 and received by the smart key 6, the smart key 6 sends to the receiver apparatus 1 a transmission signal that is modulated with data encoded by a security cipher, with that transmission occurring during an interval of predetermined duration, which begins after a predetermined time interval following the trigger signal transmission. The receiver apparatus 1 is controlled by the control ECU 2 at that time to receive the transmission frequency of the signal transmitted by the smart key 6, so that the enciphered data are demodulated by the receiver apparatus 1 from the received signal. The transmitted security cipher is thereby obtained by the control ECU 2, for enabling the control ECU 2 to verify that the holder of the smart key 6 is a valid user. If verification is successful, then the control ECU 2 subsequently enables the vehicle ignition to be turned on when the ignition switch 30 is closed by actuating the ignition key 5a, after insertion into the key cylinder. Such communication with the smart key 6, initiated by a trigger signal from the trigger unit 3, will be referred to in the following as "smart key communication".

Each sensor signal transmitter 7 can for example be fixedly mounted within the rim of a corresponding vehicle wheel, and is coupled to a corresponding tire pressure detector that is installed in the interior of the corresponding tire. In practice, the sensor signal transmitter 7 may also be coupled to a tire pressure temperature detector, for receiving information relating to the internal temperature of the corresponding tire, however for simplicity of description only the case of tire pressure information will be described herein. When a trigger signal is transmitted from the trigger unit 4 and received by a sensor signal transmitter 7, then after a predetermined time interval has elapsed, the sensor signal transmitter 7 transmits to the receiver apparatus 1 (during an interval of predetermined duration) a transmission signal that is modulated with data conveying the tire pressure information obtained from the corresponding tire pressure detector. The receiver apparatus 1 is controlled by the control ECU 2 at that time to set the receiving frequency to the transmission (carrier) frequency of the signal transmitted by the sensor signal transmitter 7, so that the data conveying tire pressure information are demodulated by the receiver apparatus 1 from the received signal, and are thereby obtained by the control ECU 2.

When the remote key 5 is actuated by the driver, it transmits a signal for effecting locking or unlocking of a vehicle door, as a function of the keyless entry system. With this embodiment as described hereinafter, so long as the ignition key 5a is not inserted in the key cylinder of the vehicle (ON signal is not being produced from the key insertion switch 31) and smart key communication or tire pressure information communication is not being performed, the control ECU 2 sets the receiving frequency of the receiver apparatus 1 to correspond with the transmission frequency of the signal transmitted from the remote key 5. That frequency will be designated as F1a which will be assumed to be 314.35 MHz with this embodiment, as an example.

It should be noted that it would be equally possible to arrange that the control ECU 2 controls the receiver apparatus 1 to receive the transmission frequency of the remote key 5 only when the ignition switch has not been set to the ON (closed) position, (i.e., ON signal is not being produced from the ignition switch 30). That is to say, the judgement step 100 of FIG. 3 (described hereinafter) could equally well be a step of judging whether or not the ignition switch 30 is set in the ON state.

The (carrier) frequency of the signal transmitted by the smart key 6 will be designated as F1b, which will be assumed to be 312.15 MHz, while that of the signal transmitted by a sensor signal transmitter 7 will be designated as F1c, which will be assumed to be 315 MHz.

For simplicity of description, only the communication with a single sensor signal transmitter 7 will be described, however it will be understood that transmitted signals can be received by the receiver apparatus 1 from each of the sensor signal transmitters 7 (following transmission of a trigger signal from the trigger unit 4) by ensuring that the respective sensor signal transmitters 7 transmit responses after respectively different amount of delay have elapsed.

The internal configuration of the receiver apparatus 1 will be described referring to FIG. 2. As shown, the receiver apparatus 1 is made up of an antenna 10 for receiving the aforementioned plurality of transmission signals having the frequencies F1a to F1c, and a receiver circuit 11 which processes signals that are received by the antenna 10. The receiver circuit 11 includes a radio-frequency BPF (bandpass filter) BPF 12, a low-noise amplifier 13, a mixer 15, an intermediate frequency BPF 16, an intermediate frequency amplifier 17, a demodulator 18, waveform shaping circuit 19 and a comparator 21. The receiver circuit 11 further includes capacitors 20a, 20b, switches 23a, 23b, 22c, and local oscillators 14a, 14b, 14c each of which can be coupled to the mixer 15 via a corresponding one of the switches 23a, 23b, 22c.

The BPF 12 receives the antenna signal from the 10 and perform bandwidth limiting of that signal to output a bandwidth limited signal within a predetermined range of frequencies, which is then amplified by the linear amplifier 13.

The local oscillators 14a, 14b, 14c produce respective fixed-frequency signals that are selectively supplied (under the control of the control ECU 2) to the mixer 15, for respectively converting the amplified signals from the linear amplifier 13, having frequencies F1a, F1b, F1c, to a common intermediate frequency F3. F3 will be assumed to be 10.7 MHz with this embodiment.

Specifically, assuming the aforementioned values for the frequencies F1a, F1b, F1c, the local oscillator 14a produces a signal fixed at a frequency F2a of 303.65 MHz, i.e., differing by the intermediate frequency 10.7 MHz from the frequency F1a. Similarly, with this embodiment the local oscillator 14b produces a signal F2b fixed at the frequency of 301.45 MHz, differing by the intermediate frequency 10.7 MHz from the frequency F1b, while the local oscillator 14a produces a signal fixed at a frequency F2c of 304.3 MHz, i.e., differing by 10.7 MHz from the frequency F1c. The received modulated signal that is outputted at the intermediate frequency from the mixer 15 is then bandwidth limited by the BPF 16, before amplified by the amplifier 17 and supplied to the demodulator 18.

Hence, the transmission frequency that will be received by the receiver circuit 11 is determined by the one of the local oscillators 14a, 14b, 14c that is currently selected to be connected to the mixer 15, by a control signal from the control ECU 2 acting on the corresponding one of the switches 22a, 22b, 22c.

The demodulator 18 demodulates the intermediate frequency signal that is outputted from the amplifier 17, to extract a demodulated data signal.

The demodulated data signal from the demodulator 18 is then subjected to waveform shaping by the waveform shaping circuit 19. The capacitors 20a, 20b have respectively different value of capacitance and each can be coupled to the waveform shaping circuit 19 via the corresponding one of the switches 23a, 23b, for optimizing a filter constant of the waveform shaping circuit 19, and thereby optimize the waveform shaping, in accordance with the requirements of a modulated signal that is currently being received by the receiver circuit 11. The switches 23a, 23b are controlled by control signals produced from the control ECU 2, in accordance with the local oscillator that is currently selected, to effect this optimization of the waveform shaping.

As a result, the filter constant of the waveform shaping circuit 19 is modified, by means of the capacitors 23a, 23b, in accordance with the data rate of the data conveyed by the modulated signal that is currently being received by the receiver circuit 11.

The waveform-shaped output signal from the waveform shaping circuit 19 is then converted to a binary data stream by the comparator 21, which is supplied to the control ECU 2.

Figure 3:
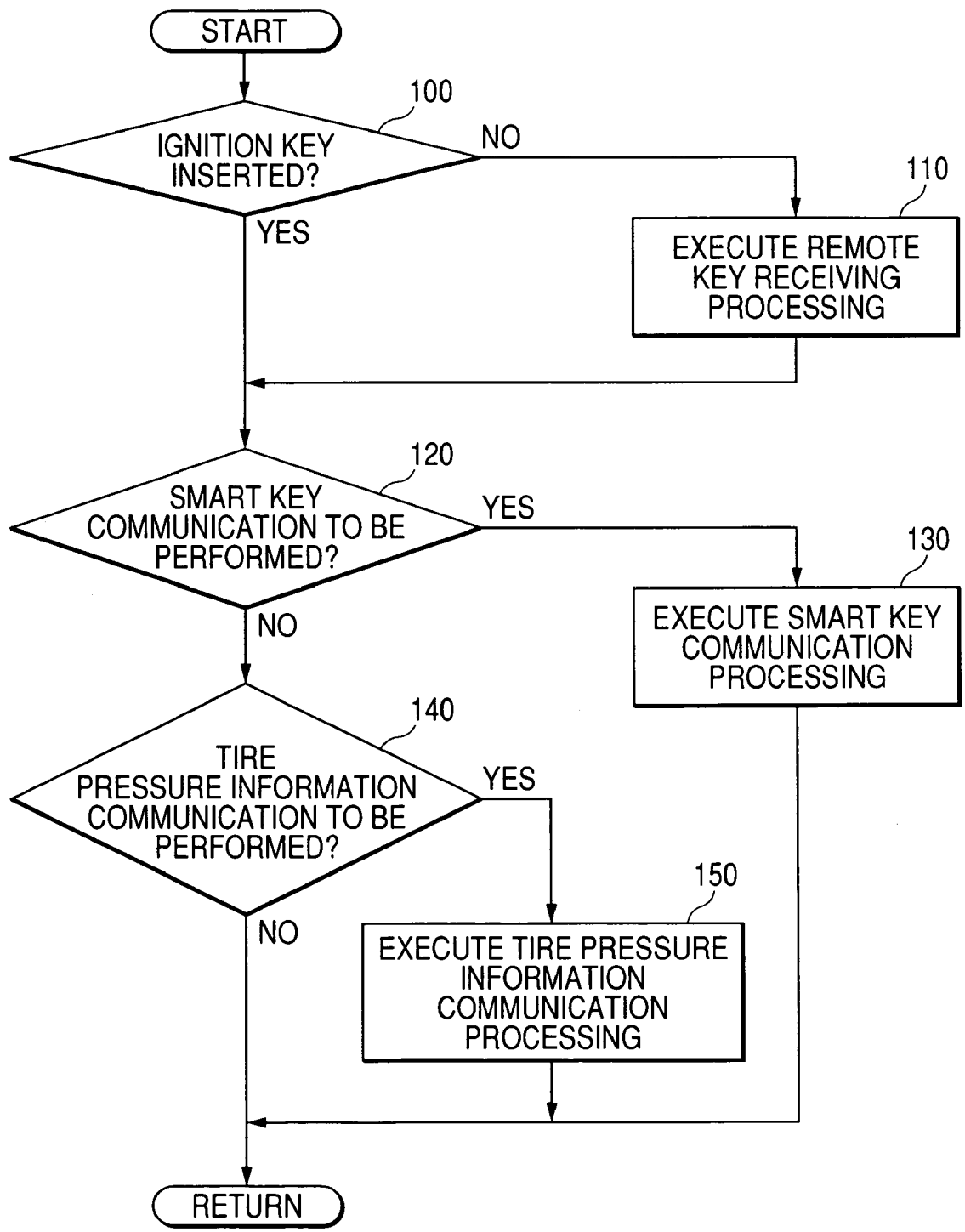
FIG. 3 is a flow diagram of processing executed by a control ECU of the embodiment.

The operation of the embodiment will be further described referring to the flow diagram of FIG. 3 and the timing diagrams of FIGS. 4A, 4B. FIG. 3 shows a receiving control processing routine that is repetitively executed by the microcomputer 2a of the control ECU 2. Firstly, a decision is made as to whether the ignition key 5a is currently inserted within the key cylinder. This decision is made based upon whether or not an ON signal is being produced by the key insertion switch 31, and serves to indicate whether the driver has entered the vehicle (i.e., in which case it is no longer necessary to set the receiving frequency of the receiver circuit 1 for receiving transmissions from the remote key 5).

If a NO decision is reached in step 100 then processing proceeds to step 110, while if there is a YES decision then operation proceeds to step 120. In step 110, remote receiving processing is performed, in which the control ECU 2 supplies control signals to set the switch 22a in the ON state while holding the switches 22b, 22c each OFF, so that the local oscillator signal of frequency F2a is inputted to the mixer 15, and hence the transmission frequency of the remote key 5 is selected to be received. At this time, both of the switches 23a, 23b are held in the OFF state, so that the filter constant of the waveform shaping circuit 19 has a default value. That condition is maintained during an interval of predetermined duration, whereupon operation proceeds to step 120.

If it is judged in step S100 that the ignition key 5a is currently inserted in the key cylinder, then in step 120 a decision is made as to whether the start of a smart signal receiving interval has been reached.

The "smart" communication is performed for determining whether to enable ignition switch-on to be performed using the ignition key 5a (i.e., to enable ignition switch-on to occur in response to the ignition switch 30 being set to ON), with that determination based on whether the security cipher conveyed by the signal from the smart key 6 is verified as being a valid code. As described above, that security cipher is conveyed by a signal transmitted from the smart key 6, during a predetermined "smart signal receiving interval" following a trigger signal transmission from the trigger unit 3 (if that transmission is received by the smart key 6). With this embodiment, the control ECU 2 predicts the starting point of each smart signal receiving interval as a count value, by beginning a count by a time counter (not shown in the drawings) at the time when the control ECU 2 sends a trigger control signal to the trigger unit 3 (for initiating a trigger signal transmission by the trigger unit 3), and detecting the time point at which the count subsequently attains a predetermined value. That time point is made the starting point of the smart signal receiving interval.

The duration of the smart signal receiving interval is made sufficiently long to include an entire transmission interval of the smart key 6.

If there is a YES decision in step 120, then smart signal receiving processing as described above is executed in step 130, to receive a response transmission from the smart key 6.

During the smart signal receiving interval, the control ECU 2 supplies control signals to set the switch 22b in the ON state while setting both of the switches 22a, 22c in the OFF state, so that the local oscillator signal of frequency F2b is inputted to the mixer 15. At this time, a control signal from the control ECU 2 sets the switch 23a in the ON state, whereby the filter constant of the waveform shaping circuit 19 is optimized for perform waveform shaping of a demodulated received signal that originated from the smart key 6. Data including the security cipher transmitted from the smart key 6 are thereby supplied from the receiver apparatus 1 to the control ECU 2.

When the processing of step 130 is completed, or if there is a NO decision in step 120, operation proceeds to step 140 in which a decision is made as to whether a time point has been reached at which tire pressure information is to be acquired, i.e., the start of a tire pressure information receiving interval has been reached.

With this embodiment, tire pressure communication is performed only by bidirectional communication between the sensor signal transmitter 7 and receiver apparatus 1 so long as the ignition key 5a is not inserted in the key cylinder. Here, "bidirectional communication" signifies that the sensor signal transmitter 7 transmits a signal conveying tire pressure information, etc., to the receiver apparatus 1 in response to a trigger signal being transmitted from the trigger unit 4 to the sensor signal transmitter 7, as opposed to unidirectional communication in which the sensor signal transmitter 7 by itself transmits such information at periodic intervals.

Specifically, at certain times, e.g., occurring periodically, the control ECU 2 transmits a trigger signal to the trigger unit 4. This is received by the sensor signal transmitter 7, which then begins to transmit to the receiver apparatus 1 a signal conveying the aforementioned tire pressure information etc., with this transmission occurring during a tire pressure information receiving interval of predetermined duration, following the transmission of the trigger signal from the trigger unit 4. In the same way as described for smart signal receiving intervals hereinabove, the time axis location and duration of each tire pressure information receiving interval are predetermined such that each transmission interval of the sensor signal transmitter 7 occurs during a corresponding tire pressure information receiving interval. Determination of the time axis location and duration of each tire pressure information receiving interval is performed using a time counter that is activated when the control ECU 2 initiates a transmission signal transmission by the trigger unit 4, as described for the smart signal receiving intervals. In that way, the control ECU 2 can predict each interval in which a signal conveying the aforementioned tire pressure information etc., will be transmitted by the sensor signal transmitter 7. Hence, the control ECU 2 sets the local oscillator frequency of the receiver circuit 11 to the appropriate value for receiving a responds signal transmitted from the sensor signal transmitter 7, throughout the tire pressure information receiving interval.

If it is judged in step 140 of FIG. 3 that the start of a tire pressure information receiving interval has been reached (YES decision) then operation proceeds to step 150, to perform processing for receiving the signal transmitted by the sensor signal transmitter 7.

Specifically, during a tire pressure information receiving interval, the control ECU 2 supplies a control signal to set the switch 22c in the ON state, so that the local oscillator signal of frequency F2c is inputted to the mixer 15. In addition at this time, a control signal from the control ECU 2 sets the switch 23b in the ON state, whereby the filter constant of the waveform shaping circuit 19 is optimized for performing waveform shaping of a demodulated received signal that originated from the sensor signal transmitter 7. Data including tire pressure information, etc., transmitted from the sensor signal transmitter 7, are thereby supplied from the receiver apparatus 1 to the control ECU 2.

The above operations can be summarized as follows, referring to the timing diagram example of FIGS. 4A, 4B, where FIG. 4B shows details of part of FIG. 4A. The diagrams illustrate successive receiving statuses that are attained by the embodiment, before, during and after a driver enters the vehicle and begins to operate it. Firstly, in a condition in which the ignition key is not yet inserted in the key cylinder, and in which the security cipher of the smart key 6 has not yet been verified (this verification being referred to in the following as "smart verification"), the trigger unit 3 and the trigger unit 4 perform transmissions in response to trigger control signals supplied from the control ECU 2, at respective periodic intervals. In this condition, other than when a smart signal receiving interval or a tire pressure information receiving interval occurs as described above (i.e., so long as a NO decision is reached in each of steps 120, 140 of FIG. 3), the receiver apparatus 1 is set to receive a signal transmitted from the remote key 5, so that the local oscillator frequency F2a is supplied to the mixer 15. This condition will arise when the driver is outside the vehicle, and enables the driver to momentarily actuate the remote key 5 and thereby lock or unlock a vehicle door from the exterior.

Next when the driver enters the vehicle, the transmitted signal from the smart key 6 begins to be received by the receiver apparatus 1, for example commencing at time point t1' in FIG. 4B. The security cipher conveyed by that signal is demodulated by the receiver circuit 11 and supplied to the control ECU 2 for verification. If the verification is positive then when the driver inserts the ignition key 5a in the key cylinder (time point t3) so that an ON signal is produced from the key insertion switch 31, ignition switch-on is enabled to occur when the ignition key 5A is then actuated to the "ignition-on" position.

FIG. 4B shows details of the smart signal receiving interval from t1 to t2 in FIG. 4A. At time point t1', the control ECU 2 sends a trigger control signal to the trigger unit 3, and begins the aforementioned time counting. When the count has reached a first predetermined value at time point t1, corresponding to the start of a "smart" signal receiving interval, the switches 22a, 22b, 22c are respectively set as shown, to set the receiver circuit 11 for receiving a transmission from the smart key 6. When the count has reached a second predetermined value, corresponding to the end of the "smart" signal receiving interval (time point t2), the switches 22a, 22b are returned to the condition for receiving transmissions from the remote key 5.

After the ignition key 5a has been in inserted in the key cylinder (time point t3), until the ignition key 5a is subsequently removed, no further processing is executed for receiving transmissions from the remote key 5, i.e., switch 22a is held continuously OFF.

After the ignition key is inserted and a tire pressure information receiving interval occurs, the status for receiving tire pressure information is established. If a smart key receiving interval occurs (e.g., from t4 to t5), the status for receiving tire pressure information is restored after the smart key receiving interval elapses.

The control ECU 2 periodically sends a trigger control signal to the sensor signal transmitter 7 and then receives transmitted tire pressure information from the receiver apparatus 1 during a subsequent tire pressure information receiving interval as described above. However the embodiment can be configured such that while the ignition key 5a is inserted in the key cylinder, the sensor signal transmitter 7 may itself also initiate transmissions of signals conveying tire pressure information, to be received by the receiver apparatus 1.

Subsequently, when the ignition is switched off and the ignition key 5a is then removed from the key cylinder (time point t6), the control ECU 2 returns the receiver apparatus 1 to the remote key receiving status, in which a signal transmitted from the remote key 5 can be received (other than during each smart signal receiving interval or tire pressure information receiving interval). The driver can thereby actuate the remote key 5 to lock or unlock a vehicle door.

In this condition, on completion of each smart signal receiving interval or tire pressure information receiving interval, the control ECU 2 returns the receiver apparatus 1 to the condition for receiving signals transmitted from the remote key 5.

It can thus be understood that with this embodiment, the system predicts respective timings at which signals will begin to be transmitted to the receiver apparatus 1 from each of a plurality of devices, and based on the predicted timings, the receiving frequency of the receiver apparatus 1 is set to the transmission frequency of a device which is predicted to begin transmitting during a predetermined interval. Specifically with this embodiment, one of a plurality of local oscillator frequencies is selected to be utilized by the receiver apparatus 1, i.e., the appropriate local oscillator frequency for receiving the signal that is predicted to be transmitted from a specific device.

In that way, a single receiver apparatus can be used in common for a keyless entry system, a smart entry system having functions such as a "smart start" function for enabling only a verified user to switch on the ignition or start the vehicle engine, a tire pressure detection apparatus, etc. Thus the overall system configuration can be simplified by comparison with a system in which respectively different receiver apparatuses must be utilized. Manufacturing costs can thereby be reduced.

Second Embodiment

A second embodiment of a vehicle receiver system will be described referring to FIG. 5, which shows the internal configuration of a receiver circuit 11 of this embodiment. This embodiment differs from the first embodiment only with respect to the internal configuration of the receiver circuit 11, and only the points of difference will be described in the following.

As shown, this embodiment utilizes a single local oscillator 14 in conjunction with a PLL (phase lock loop) 24, controlled by a control signal produced from the control ECU 2, in place of the local oscillators 14a to 14C and switches 22a to 22c of the first embodiment, for supplying a local oscillator signal to the mixer 15.

The PLL 24 is a known type of PLL, producing an output signal based on a signal supplied from the local oscillator 14 as a frequency reference. The frequency of the output signal from the PLL 24 is selectively set to the currently appropriate one of the plurality of local oscillator frequencies F2a to F2c, by the control signal from the control ECU 2. Hence, the operation of this embodiment differs from that of the first embodiment only in that a single control signal produced from the control ECU 2 effects changeover of the frequency of the local oscillator signal that is supplied to the mixer 15, as opposed to a configuration in which control signals from the control ECU 2 operate on a plurality of switches 22a to 22c as with the first embodiment.

It can thus be understood that similar effects can be achieved with this embodiment to those obtainable with the first embodiment.

Additional Embodiments

With the above embodiments, it is assumed that the tire pressure detection apparatus has a bidirectional communication capability. However this is not essential, and it would be equally possible to apply the invention to a system in which the sensor signal transmitter 7 performs only unidirectional communication with the receiver apparatus 1, i.e., a configuration in which the trigger unit 4 of FIG. 1 is omitted.

This is illustrated in the timing diagram example of FIG. 6. In this case the receiver apparatus 1 is:

(a) (other than when a smart signal receiving interval occurs) held in the status for receiving a signal at the transmission frequency of the remote key 5 so long as the ignition key 5a is not inserted in the key cylinder, and (b) (other than when a smart signal receiving interval occurs) is held in the status for receiving a signal at the transmission frequency of the sensor signal transmitter 7 so long as the ignition key 5a is inserted in the key cylinder.

Each receiver system of the above embodiments performs in common the receiving functions of a keyless entry system, a smart key system, and a tire pressure detection apparatus. However it would be equally possible to configure such a receiver system to perform only two of the above receiving functions in common.

This is illustrated by the timing diagram example of FIG. 7. Only unidirectional communication is executed with the sensor signal transmitter 7. With this embodiment the receiver apparatus 1 is:

(a) held in the status for receiving a signal at the transmission frequency of the remote key 5 so long as the ignition key 5a is not inserted in the key cylinder, and (b) is held in the status for receiving a signal at the transmission frequency of the sensor signal transmitter 7 so long as the ignition key 5a is inserted in the key cylinder.

Alternatively, an embodiment can be envisaged in which the receiver apparatus 1 performs in common only the receiving functions for the keyless entry system and the tire pressure detection apparatus, but with the sensor signal transmitter 7 being capable of bidirectional communication with the receiver apparatus 1. This is illustrated by the timing diagram example of FIG. 8. In this case, the receiver apparatus 1 is:

(a) held in the status for receiving a signal at the transmission frequency of the remote key 5 so long as the ignition key 5a is not inserted in the key cylinder, (b) is held in the status for receiving a signal at the transmission frequency of the sensor signal transmitter 7 so long as the ignition key 5a is inserted in the key cylinder, and (c) if a tire pressure information (bidirectional) communication interval is initiated during operation in the remote key signal receiving status (for example, between time points t3, t4 of FIG. 8), then priority is given to the tire pressure information communication. That is to say, the receiver apparatus 1 is temporarily set in the status for receiving a signal at the transmission frequency of the sensor signal transmitter 7, for the duration of a predicted tire pressure information receiving interval as described above for the first embodiment, then is returned to the remote key signal receiving status.

A sixth embodiment will be described referring to the timing diagram of FIG. 9. This embodiment differs from the first embodiment in that opening or closing of a vehicle door by operating the remote key 5 is only enabled after verification has been achieved by smart signal communication, in addition to the fact that vehicle ignition switch-on is enabled only after verification has been achieved, as described for the first embodiment.

As shown in FIG. 9, when verification of the security cipher transmitted by the smart key 6 is achieved (e.g., as a result of communication with the smart key 6 that occurs during the interval from t1 to t2), vehicle door locking/unlocking in response to transmissions from the remote key 5 is thereafter enabled.

In other respects, the operation of this embodiment is identical to that of the first embodiment. Following the time point t3, when the ignition key 5a is inserted in the key cylinder, the receiving frequency of the receiver circuit 11 is no longer set for receiving transmissions from the remote key 5, as described for the above embodiments.

It can thus be understood that with the above embodiments, the receiving frequency that is to be currently established for a receiver apparatus is determined in accordance with one or a combination of the following:

(1) in accordance with which of two alternative conditions is currently true (e.g., the ignition key is currently inserted or not inserted in the key cylinder), with the alternative conditions being predetermined as corresponding to respectively different receiving frequencies, or (2) in accordance with prediction, that is, in accordance with whether a response transmission is currently anticipated as a result of an interrogation (i.e., trigger) transmission previously performed by the receiver apparatus, with respective interrogation target devices being predetermined as corresponding to respectively different receiving frequencies.

The invention is not limited to the embodiments described above, and various modifications or alternative forms of these embodiments could be envisaged, which fall within the scope claimed for the invention.

For example with each embodiment, it would be possible to utilize judgement of the ignition switch status rather than the key cylinder switch status, e.g., in step 100 of FIG. 3.

Moreover, the invention has been described for the case in which an ignition key must be inserted in a key cylinder of a vehicle in order to switch on the ignition. However it will be apparent that the invention could equally well be applied to new types of vehicle in which an ignition key is not utilized, and in which the driver (when "smart" verification has been achieved) can perform ignition switch-on/off and engine starting by actuating dashboard switches.

Furthermore although the embodiments have described for the case in which the receiver system performs bidirectional communication with only two remote devices (transmitting at two respectively different frequencies), it will be apparent that the principles could be applied to a receiver system for performing bidirectional communication with a greater number of remote devices which utilize respectively different transmission frequencies. The essential point is that, since the control ECU 2 always initiates communication with such a remote device (by transmitting a corresponding trigger signal to the device), the control ECU 2 can predict the timing at which a response transmission from the remote device will begin to be received, and so can set the receiver apparatus 1 appropriately for receiving the transmission frequency of that response during a specific receiving interval.

It should further be noted that the invention is not limited to use with any particular form of vehicle receiver apparatus. The only requisite is that the receiving frequency (tuned frequency) of the receiver apparatus can be selectively set to a plurality of different values in response to a control signal or signals.

What is claimed is:

1. A receiver system for installation in a motor vehicle, having a receiver apparatus comprising:
 a receiving antenna for receiving, as an antenna input signal, a plurality of modulated transmitted signals having respective ones of a predetermined plurality of carrier frequencies, and
 a receiver circuit controlled by a control signal for selecting one of said carrier frequencies as a currently determined one of a plurality of receiving frequencies, and comprising means for operating on said antenna input signal to obtain demodulated data from a received signal corresponding to said currently determined receiving frequency;
 wherein said receiver system comprises transmission timing prediction means for supplying said control signal to said receiver circuit, and
 said transmission timing prediction means determines a value for said currently determined receiving frequency based on predetermined criteria relating to equipment of said vehicle.

2. A vehicle receiver system according to claim 1, wherein said receiver apparatus comprises:
 first filter means for performing bandwidth limiting of said antenna input signal to obtain a bandwidth-limited input signal,
 amplifier means for amplifying said bandwidth-limited input signal to obtain an amplified input signal,
 local oscillator means operable for producing a local oscillator signal at a selected one of a plurality of respectively different fixed frequencies,
 intermediate frequency generating means for converting said amplified input signal to an intermediate frequency signal, at a fixed intermediate frequency whose value is a difference between a carrier frequency of said amplified input signal and said local oscillator frequency,
 second filter means for performing bandwidth limiting of said intermediate frequency signal, and
 demodulator means for demodulating said intermediate frequency signal to obtain said demodulated data;
 wherein said control signal is applied to control said local oscillator means, for setting said local oscillator frequency at a value for receiving a transmitted signal corresponding to said currently determined one of said plurality of receiving frequencies.

3. A vehicle receiver system according to claim 2, wherein said local oscillator means comprises:
 a plurality of local oscillators, and
 a plurality of switching elements, respectively coupled between said intermediate frequency generating means and a corresponding one of said plurality of local oscillators;
 wherein said control signal controls said switching elements for connecting to said local oscillator means a specific one of said local oscillators, and said specific local oscillator generates a local oscillator signal at a frequency appropriate for establishing said currently determined receiving frequency.

4. A vehicle receiver system according to claim 2, wherein said local oscillator means comprises a PLL (phase lock loop) circuit for generating said local oscillator signal, coupled to supply said local oscillator signal to said intermediate frequency generating means, and wherein said control signal controls said PLL to set said local oscillator signal to a frequency appropriate for establishing said currently determined receiving frequency.

5. A vehicle receiver system according to claim 1, wherein said plurality of receiving frequencies correspond to respective transmission frequencies of a group of devices including a remote key of a remote entry system of said vehicle, a smart key of a smart entry system of said vehicle, and a sensor signal transmitter of a tire pressure detection system of said vehicle.

6. A vehicle receiver system according to claim 1 wherein said transmission timing prediction means is coupled to receive a key insertion detection signal which attains a first state and a second state in accordance with a vehicle ignition switch being inserted or non-inserted in a key cylinder of said vehicle, respectively, and to receive an ignition switch detection signal which attains a first state and a second state in accordance with said ignition switch being set in an ignition-on condition or an ignition-off condition, wherein:
 said plurality of receiving frequencies include a carrier frequency of a remote key of a keyless entry system of said vehicle and a carrier frequency of a sensor signal transmitter of a tire pressure detection apparatus of said vehicle, and
 said transmission timing prediction means is responsive to said second state of a predetermined one of said key insertion detection signal and ignition switch detection signal for selecting said carrier frequency of said remote key as said currently determined receiving frequency, and is responsive to said first state of said predetermined one of said key insertion detection signal and ignition switch detection signal for selecting said carrier frequency of said sensor signal transmitter as said currently determined receiving frequency.

7. A vehicle receiver system according to claim 6, wherein:
said tire pressure detection apparatus comprises trigger apparatus means for repetitively transmitting an interrogation signal directed to said sensor signal transmitter, and
when said interrogation signal is transmitted, said transmission timing prediction means predicts a commencement time point and a duration of an interval of a response transmission from said sensor signal transmitter, and controls said receiver circuit to select said transmission frequency of said sensor signal transmitter to be said currently determined receiving frequency during an interval that contains said response transmission interval.

8. A vehicle receiver system according to claim 6, wherein:
said smart entry system comprises trigger apparatus means for repetitively transmitting an interrogation signal directed to said smart key, and
when said interrogation signal is transmitted, said transmission timing prediction means predicts a commencement time point and a duration of an interval of a response transmission from said sensor signal transmitter, and controls said receiver circuit to select said transmission frequency of said smart key to be said currently determined receiving frequency during an interval that contains said response transmission interval.

9. A vehicle receiver system according to claim 1, wherein said receiver circuit comprises:
waveform shaping means having a filter function, for effecting waveform shaping of a demodulated signal produced by said receiver circuit, and
filter constant alteration means for controllably altering a filter constant of said waveform shaping means,
wherein said control signal produced by said transmission timing prediction means controls said filter constant alteration means in accordance with said currently determined receiving frequency, for thereby rendering said filter constant appropriate with respect to a one of said plurality of modulated transmitted signals that corresponds to said currently determined receiving frequency.

10. A vehicle receiver system according to claim 1, wherein said predetermined criteria include a result of judging an ignition status of said vehicle.

11. A vehicle receiver system according to claim 10, wherein said ignition status comprises an insertion condition of an ignition key in a key cylinder of said vehicle.

12. A vehicle receiver system according to claim 10, wherein said ignition status comprises a status of an ignition switch of said vehicle.

13. A vehicle receiver system according to claim 1, wherein:
said receiver system comprises trigger apparatus means for repetitively transmitting an interrogation signal directed to a specific external device, and
said predetermined criteria include a result of judging whether a first predetermined time interval has elapsed since a transmission of said interrogation signal was performed.

14. A vehicle receiver system according to claim 13, wherein
said external device is adapted to respond to said interrogation signal by transmitting a response signal as one of said plurality of modulated transmitted signals during a second predetermined time interval immediately succeeding said first predetermined time interval, and
said control signal controls said receiving circuit to select a carrier frequency of said response signal as said currently determined receiving frequency during a time interval which contains said second predetermined time interval.

15. A method of operating a system in a motor vehicle, in which the system includes a receiving antenna and a receiving circuit, the method comprising:
receiving, in the receiving antenna, as an antenna input signal, a plurality of modulated transmitted signals having respective ones of a predetermined plurality of carrier frequencies;
controlling the receiving circuit by a control signal to select one of said carrier frequencies as a currently determined one of a plurality of receiving frequencies; and
operating on said antenna input signal to obtain demodulated data from a received signal corresponding to said currently determined receiving frequency;
wherein a value for the control signal is determined, to select one of the carrier frequencies as the currently determined receiving frequency, based on predetermined criteria relating to equipment of the vehicle, and
said control signal is supplied to the receiver circuit to select one of the carrier frequencies as the currently determined one of a plurality of receiving frequencies.

16. The method according to claim 15, wherein said plurality of receiving frequencies correspond to respective transmission carrier frequencies of a group of devices including a remote key of a remote entry system of said vehicle, a smart key of a smart entry system of said vehicle, and a sensor signal transmitter of a tire pressure detection system of said vehicle.

17. The method according to claim 15, further comprising:
receiving, in a controller of the system, a key insertion detection signal which attains a first state and a second state in accordance with a vehicle ignition switch being inserted or non-inserted in a key cylinder of the vehicle, respectively, and
receiving, in the controller of the system, an ignition switch detection signal which attains a first state and a second state in accordance with said ignition switch being set in an ignition-on condition or an ignition-off condition,
wherein: said plurality of receiving frequencies include a carrier frequency of a remote key of a keyless entry system of said vehicle and a carrier frequency of a sensor signal transmitter of a tire pressure detection apparatus of said vehicle, and
said controller is responsive to said second state of a predetermined one of said key insertion detection signal and ignition switch detection signal for selecting said carrier frequency of said remote key as said currently determined receiving frequency, and is responsive to said first state of said predetermined one of said key insertion detection signal and ignition switch detection signal for selecting said carrier frequency of said sensor signal transmitter as said currently determined receiving frequency.

18. The method according to claim 17, further comprising:
repetitively transmitting an interrogation signal directed to said sensor signal transmitter,
when said interrogation signal is transmitted, predicting a commencement time point and a duration of an interval of a response transmission from said sensor signal transmitter, and
controlling said receiver circuit to select said transmission frequency of said sensor signal transmitter to be said currently determined receiving frequency during an interval that contains said response transmission interval.

19. The method according to claim 17, further comprising:
repetitively transmitting an interrogation signal directed to said smart key,
when said interrogation signal is transmitted, predicting a commencement time point and a duration of an interval of a response transmission from said sensor signal transmitter, and
controlling said receiver circuit to select said transmission frequency of said smart key to be said currently determined receiving frequency during an interval that contains said response transmission interval.

20. The method according to claim 15, wherein said predetermined criteria include a result of judging an ignition status of said vehicle.

21. The method according to claim 20, and said ignition status comprises an insertion condition of an ignition key in a key cylinder of said vehicle.

22. The method according to claim 20, wherein said ignition status comprises a status of an ignition switch of said vehicle.

23. The method according to claim 15, wherein said system further comprises a transmitter for repetitively transmitting an interrogation signal directed to a specific external device, and said predetermined criteria include a result of judging whether a first predetermined time interval has elapsed since a transmission of said interrogation signal was performed.

24. The method according to claim 23, wherein said receiving antenna receives a response signal to said interrogation signal which is transmitted by a external device as one of said plurality of modulated transmitted signals during a second predetermined time interval immediately succeeding said first predetermined time interval, and the control signal controls the receiving circuit to select a carrier frequency of the response signal as said currently determined receiving frequency during a time interval which contains said second predetermined time interval.

* * * * *